United States Patent
Klippe et al.

(10) Patent No.: US 7,541,102 B2
(45) Date of Patent: *Jun. 2, 2009

(54) PROTECTIVE LAYER FOR A BODY, AND PROCESS AND ARRANGEMENT FOR PRODUCING PROTECTIVE LAYERS

(75) Inventors: Lutz Klippe, Wiesbaden (DE); Cora Krause, Burrweiler (DE); Jürgen Dzick, Seelze (DE)

(73) Assignee: Schott AG, Mainz (DE)

( * ) Notice: Subject to any disclaimer, the term of this patent is extended or adjusted under 35 U.S.C. 154(b) by 126 days.

This patent is subject to a terminal disclaimer.

(21) Appl. No.: 10/936,368

(22) Filed: Sep. 8, 2004

(65) Prior Publication Data

US 2005/0084705 A1 Apr. 21, 2005

(30) Foreign Application Priority Data

Sep. 13, 2003 (DE) ................................ 103 42 398

(51) Int. Cl.
*B32B 9/00* (2006.01)

(52) U.S. Cl. ................... 428/701; 428/702; 428/698

(58) Field of Classification Search ................. None
See application file for complete search history.

(56) References Cited

U.S. PATENT DOCUMENTS

| 4,321,310 | A | * | 3/1982 | Ulion et al. | .................. 428/612 |
| 4,321,311 | A | | 3/1982 | Strangman | .................. 428/623 |
| 4,401,697 | A | * | 8/1983 | Strangman | .................. 427/250 |
| 4,643,951 | A | | 2/1987 | Keem et al. | |
| 4,920,014 | A | | 4/1990 | Hirai et al. | .................. 428/698 |
| 5,594,231 | A | | 1/1997 | Pellicori et al. | .................. 235/462 |
| 5,930,046 | A | | 7/1999 | Solberg et al. | |

(Continued)

FOREIGN PATENT DOCUMENTS

DE 4201914 7/1992

(Continued)

OTHER PUBLICATIONS

Article; Proceedings of the Seventh International Conference on Chemical Vapor Deposition-VII, 536 (1979), G. Wehl et al., Electrothermics & Metallurgy, Electronics, and Dielectrics and Insulation Divisions, Proceedings vol. 79-3, pp. 536-543.

(Continued)

Primary Examiner—Timothy M Speer
(74) Attorney, Agent, or Firm—Ohlandt, Greeley, Ruggiero & Perle, L.L.P.

(57) ABSTRACT

A protective layer having at least one hard-material layer is provided. The hard-material layer is formed from one or more of the following materials metal oxide, metal nitride, metal carbide, metal oxynitride, metal carbonitride, and metal oxycarbonitride. The hard-material layer has laterally closely cohesive, crystalline columns which grow perpendicular to the surface of the body. In some embodiments, the crystalline columns have a lateral dimension which is on average less than 1 μm, preferably less than 200 nm, and which predominantly has crystal orientations which, in the case of columnar growth, have little tendency to widen out, the surface roughness of the hard-material layer having an $R_a$ value of less than 50 nm, preferably less than 20 nm.

11 Claims, 1 Drawing Sheet

U.S. PATENT DOCUMENTS

| | | | |
|---|---|---|---|
| 5,944,964 | A | 8/1999 | Solberg et al. |
| 6,346,301 | B2 * | 2/2002 | Beele et al. ............... 427/561 |
| 6,579,590 | B2 | 6/2003 | Ju et al. |
| 6,797,388 | B1 | 9/2004 | Szanyi et al. |
| 7,018,727 | B2 | 3/2006 | Dzick |
| 2004/0258947 | A1 * | 12/2004 | Moelle et al. ............... 428/627 |

FOREIGN PATENT DOCUMENTS

| | | | |
|---|---|---|---|
| DE | 4201914 A1 | | 7/1992 |
| DE | 20106167 | | 7/2001 |
| DE | 20106167 U1 | | 7/2001 |
| DE | 10000663 | | 9/2001 |
| DE | 10000663 A1 | | 9/2001 |
| EP | 0 176 270 | | 9/1985 |
| EP | 0548972 | | 6/1993 |
| EP | 0716270 | | 7/2000 |
| EP | WO 2004026785 | * | 4/2004 |
| JP | 62178336 | | 8/1987 |
| JP | 10500633 | | 1/1998 |
| JP | 2005538028 | | 12/2005 |
| WO | WO95/23652 | | 9/1995 |
| WO | WO 96/31995 | | 10/1996 |

OTHER PUBLICATIONS

Article: XP 002911055, "Evolution of Surface Roughness and Scatter in Evaporated Zirconia/silica Multilayer Coatings," Klingler & Swab, Optical Coating Laboratory, Inc., SPIE vol. 678 Optical thin Films II-New Developments (1986), pp. 41-50.

Article: XP 4183089A1, "Comparison of Pure and Mixed Coating Material for AR Coatings for Use by Reactive Evaporation on Glass and Plastic Lenses," by Selhofer and Mueller, Balzers Ltd., Elsevier, Thin Solid Films 351 (1999) pp. 180-183.

Office Action from corresponding Japanese Patent Application No. 2004-264955 dated Aug. 15, 2008.

Henryk Tomszewski et al., "Yttria-stabilized zirconia thin films grown by reactive r.f. magnetron supttering," Thin Solid Films, Switzerland, Elsevi Er-Sequoia S.A., Oct. 30, 1996, pp. 104-109.

Henryk Tomszewski et al., "Yttria-stabilized zirconia thin films grown by reactive r.f. magnetron supterring from an oxide target," Thin Solid Films, Switzerland, Elsevi Er-Sequoia S.A., Jan. 30, 1997, pp. 67-64.

* cited by examiner

PROTECTIVE LAYER FOR A BODY, AND PROCESS AND ARRANGEMENT FOR PRODUCING PROTECTIVE LAYERS

BACKGROUND OF THE INVENTION

1. Field of the Invention

The invention relates to a protective layer, in particular to a hard-material layer with a high scratch resistance and thermal stability, and to a process and an arrangement for producing protective layers.

The invention relates specifically to a protective layer for glass-ceramic plates, and to a process and apparatus for coating them, these glass-ceramic plates preferably being used as cooking plates in cooking hobs and having a protective layer with a higher scratch resistance than the uncoated glass-ceramic on at least one side.

2. Description of Related Art

Modern cooking hobs have a glass-ceramic plate as the cooking plate, the glass-ceramic plate typically being planar, although it may also be deformed in two or three dimensions. Glass-ceramic plates are both known from printed literature and commercially available, either in undecorated form or decorated with thermally stable colors, e.g. ceramic colors. The cooking plate has individual cooking zones which are heated inductively, by electrically operated radiant heaters, by gas radiant heating elements or by alternative heating systems (for example DHS produced by SCHOTT).

Glass-ceramic plates typically have a Mohs hardness of from 5-6, which is comparable to that of steel, from which cookware is typically produced. Everyday use, for example the cookware being put down and moved around, and the cooking plates being cleaned with abrasive cleaning agents and sponges or with a scraper, imposes a high mechanical loading on the cooking hob, which can lead to traces of use being produced on the hob.

In addition, the cooking plate is often also used as an additional work surface in the cold state. In particular in this state, there is a high risk of surface damage forming, for example through damage caused by rough bases of ceramic objects. All the surface damage incurred, over the course of time, leads to the formation of scratches on the surface, which is more or less noticeable to the user depending on the selected illumination. An additional factor is that damage to the surface offers points of attack for soiling. The ease of cleaning of the surface becomes restricted, since it is much more difficult to clean dirt out of this damage. This effect is independent of whether the cooking hob is transparent, colored or translucent.

The previous generation of glass-ceramic plates had a typical surface structure which was similar to orange peel. Although these plates were also scratched as a result of the phenomena described above, they had a relatively low susceptibility to scratches on account of the additional surface structure. However, over the course of time, the surfaces of glass-ceramic plates have become smoother and shinier, which for the reasons mentioned above leads to an increased susceptibility to scratching.

EP 0 716 270 B1 describes a cooking plate formed from glass-ceramic, on the top side of which a décor is provided, this cooking plate, in order to avoid scratches and traces of use, having a protective layer in the form of enamel fluxes or a silicate coating with a higher scratch resistance than glass-ceramic, with this protective layer covering the glass-ceramic cooking plate continuously or as continuously as possible, and a décor being printed onto this protective layer or directly onto the glass-ceramic surface. It is preferable for the protective layer to be formed from a dark material. Although this protective layer in principle increases the mechanical load-bearing capacity of the glass-ceramic cooking plates, such that when the cooking plate is in use the susceptibility to scratches can be reduced compared to an unprotected cooking plate, the enamel flux or silicate protective layers which are all that is disclosed by the EP document still do not offer optimum long-term mechanical protection. Specifically, one drawback is that the protective layer itself represents a décor which is applied by means of screen printing. These décor colors are generally based on the same fluxes as the décor colors used for optical design purposes. Therefore, they are subject to the same restrictions in terms of abrasion. The minimum dimension of décors of this type is of the order of magnitude of 0.5 mm, which is in any event visually perceptible and therefore interferes with the design, in particular if glasses or glass-ceramics with smooth surfaces are desired.

Furthermore, the explanations given do not allow any conclusions to be drawn as to the extent to which the proposed solution is compatible with the heater systems used. In particular the use of preferably dark materials as protective layer for glass-ceramics with a high IR transparency and radiant heaters will lead to restrictions in terms of the desired IR transparency and therefore to losses in terms of the initial cooking performance.

DE 100 00 663 A1 describes a process and the associated apparatus for providing an optically transparent body with a scratch-resistant layer of $Al_2O_3$ over the entire surface by means of a modified PICVD process, in such a manner that a hard-material layer is formed, since it has been found that the known processes cannot be used to produce a sufficiently hard, dense, scratch-resistant and thermally stable layer, in particular from aluminum oxide. One drawback is the high cost of the process, in particular if large-area coatings have to be applied homogeneously. Hitherto, inhomogeneities have been inevitable, and this moreover has a long-term adverse effect on the visual appearance.

Furthermore, WO 96/31995 describes an inductively heated glass or glass-ceramic cooking plate with integrated coils, to which a hard-material layer of $Al_2O_3$ is applied by means of the plasma spraying technique, in a layer thickness of between 50 and 200 μm. One drawback in this context is that such thick layers are very rough, and therefore the use properties, such as the abrasion caused by pots and pans, manual abrasion and the cleaning properties are adversely affected. Furthermore, the appearance of the cooking plates having a layer of this type changes completely. The surface appears matt and gray.

Furthermore, it is known from DE 42 01 914 A1 (=U.S. Pat. No. 5,594,231) to provide scanning windows made from glass or glass-ceramic for scanning systems, installed in tills in supermarkets and other retail markets, for detecting bar codes applied to the packaging of goods with a transparent hard-material layer on the top side, and then for a transparent coating with sliding properties to be provided on the hard-material layer, to make this scanning window more resistant to wear. Materials which are mentioned as being suitable for the hard-material layer include metal oxides, such $Al_2O_3$, $ZrO_2$, $SnO_2$, $Y_2O_3$. Aluminum oxide which is deposited in amorphous form is referred to as being particularly suitable. In particular the amorphous deposition of the metal oxide in this context promotes the desired improved hardness and sliding properties of the protective layer. The hard-material layers described here are suitable for applications in the room temperature range, but their properties change at high temperatures, as are customary, for example, in the case of cooking plates, making them unsuitable for use at high temperatures. A protective layer for cooking plates requires materials which are able to withstand temperatures of up to 800° C. and which are also able to tolerate the high thermomechanical stresses which occur between the glass-ceramic and the protective layer.

DE 201 06 167 U1 has disclosed a cooking hob with a glass-ceramic plate as cooking plate, this plate being provided with a transparent scratchproof layer which may be formed, inter alia, by a hard-material layer. Metal oxides, such as aluminum oxide, zirconium oxide, yttrium oxide, tin oxide, indium oxide and combinations thereof, are among the materials mentioned for this transparent layer. According to this document, the materials can be deposited, for example, using the sol gel technique, the CVD processes, in particular by means of the PICVD process, and by sputtering.

With the known processes for producing hard-material layers, such as for example those described in the abovementioned documents DE 42 01 914 A1 and DE 201 06 167 U1, the layers are typically deposited in an amorphous or partially crystalline structure. After prolonged use in the hot areas, or in the event of maximum thermal loading, layers of this type may undergo disadvantageous changes. For example, in these areas the layers may become discolored as a result of thermally induced compacting or may be opacified through crystallization, with the result that the hot areas become optically perceptible. Furthermore, roughening in the range from 1 to 1000 nm may occur. The roughening alone may be optically perceptible, and the recesses which form additionally make cleaning more difficult. The problem of crystallization in the hot areas is exacerbated by mechanical failure of the scratchproof layer. During crystallization, the structure of the layer changes, with the result that cracks are formed in the layer. The loss of lateral cohesion means that the layer no longer offers any particular protection against scratching.

In order, for example, to impart a higher thermal stability to zirconium oxide, it is known (G. Wehl et al., Proc. CVD-VII, 536 (1979)) to add what are known as stabilizers formed from yttrium oxide, magnesium oxide or calcium oxide to this component. However, a layer of this type, produced using the known processes, has a low density, which means that a layer of this type is porous.

The process described in U.S. Pat. No. 4,920,014 for producing a layer of this type from stabilized zirconium oxide attempts to solve this problem by the layer being deposited in such a way, by means of the CVD process and accurately set process parameters, such as temperature of the substrate, instant and duration of the supply of the reaction substances, etc., that it has only one or two crystal planes oriented parallel to the substrate surface. In addition to entailing very high process costs, crystalline layers of this type still have a rough surface.

It is known from the field of turbine technology that layers grown in column form have a particularly high resistance to rapid fluctuating thermal loads. For example, U.S. Pat. No. 4,321,311 describes the use of a ceramic layer which is grown in columnar form as thermal protection for metallic components used in turbine manufacture. However, on account of their coarse crystalline structures, the layers described in this document have a high roughness or porosity.

Rough and porous surfaces quickly become dirty and are difficult to clean. Moreover, they are not visually clear and transparent, but rather are highly diffractive and are unsuitable for applications with visually attractive surfaces.

The scratch resistance problems encountered with other optically transparent bodies formed from glass or glass-ceramic which are exposed to high use temperatures, for example chimney viewing windows, oven windows for pyrolysis ovens, etc., are similar to those encountered with cooking plates.

BRIEF SUMMARY OF THE INVENTION

The invention is based on the object of forming the protective layer for a body in such a manner that it is scratch and wear-resistant, remains structurally stable and does not change visually in the event of thermal loading, and has a permanently smooth and visually attractive surface.

This object is achieved by a protective layer as described-herein, a process as described herein and an apparatus as described herein.

The protective layer according to the invention for a body includes at least one hard-material layer formed from a metal oxide and/or metal nitride and/or metal carbide and/or metal oxynitride and/or metal carbonitride and/or metal oxycarbonitride, with at least one of these hard-material layers having a morphologically dense column structure.

In this context, it is advantageous if these dense column structures are formed as crystalline column structures forming at least 50%, preferably more than 80%, of the layer. This layer morphology makes the layer particularly insensitive to mechanical and thermal loads.

Hard-material layers formed from metal oxide and/or metal nitride and/or metal carbide and/or metal oxynitride and/or metal carbonitride and/or metal oxycarbonitride have a very wide range of layer morphologies and properties depending on the process conditions. The setting of process conditions which allow columnar, preferably columnar crystalline, growth of the layer in tight column structures causes these hard-material layers to acquire a dense, smooth and visually attractive surface while being structurally stable under mechanical and thermal loads.

The term crystalline is generally understood as meaning the state of solids with their particles arranged in a three-dimensional space lattice with a pronounced long-range order.

The crystalline body, in this case the hard-material layer, may comprise a large number of small, irregularly supported crystallites, or the lattice structure may continue through the entire layer. The columns which form in the layer are column structures which are located closely next to one another and are formed predominantly perpendicular to the substrate. The crystals predominantly have orientations which have little tendency to widen out during columnar growth.

To minimize the porosity of the protective layer and therefore also to minimize the roughness of its surface, in a manner which is cleaning-friendly, the layer is preferably formed in such a way that the lateral dimension of the columns is less than 1 µm. In one particularly advantageous configuration, the lateral dimension of the columns is less than 200 nm. Moreover, the densely packed column structures allow substantially unimpeded optical transmission to be achieved and interfering effects caused by light scattering to be avoided.

In this context, hard-material layers formed from silicon nitride or metal oxides in temperature-stable crystal phases have proven particularly suitable for transparent protective layers according to the invention.

It has been discovered that layers according to the invention, in particular those formed from zirconium oxide or mixed layers based on zirconium oxide, are especially suitable for transparent, highly thermally stable protective layers with a particularly attractive visual appearance. A suitable deposition procedure makes it possible to produce a particularly thermally stable, dense crystalline column structure which, moreover, is highly scratch-resistant. It is advantageous in this context that the zirconium oxide layers can be stabilized in a high-temperature crystal phase by addition of other metal oxides, such as yttrium oxide, calcium oxide, magnesium oxide, tantalum oxide, niobium oxide, scandium oxide, titanium oxide or an oxide from the group of lanthanoid oxides, such as for example lanthanum oxide or cerium oxide, and combinations thereof, but in particular by the addition of 0.5 to 50 mol % of $Y_2O_3$, advantageously by the addition of 0.5 to 10 mol % of $Y_2O_3$, and particularly optimally by the addition of 4 mol % of $Y_2O_3$, in such a manner that they do not experience any temperature-dependent structural changes at least in the temperature range which is of relevance to cooking systems (up to at most 800° C.).

In addition to the hard-material layers which have been described above, the protective layer according to the invention may also contain one or more further hard-material layers. The order and number in which these further hard-material layers are formed, and the materials from which they are formed, substantially depend on the further desired optical and/or mechanical demands imposed on the protective layer.

The protective layers according to the invention are suitable for coating a very wide range of bodies, which in particular have to have a high resistance to scratching and a high thermal stability. Furthermore, they allow an attractive visual appearance and, depending on the layer material, also transparency. They are particularly suitable for use as protective layers for glass, glass-ceramic or bodies formed from other nonmetallic, crystalline materials, without being restricted to these particular applications.

The protective layer is particularly advantageously suitable for the coating of glass-ceramic cooking plates. The primary requirements in such applications are a high resistance to scratching, a high thermal stability and a visually attractive appearance, and these requirements can be satisfied by the coating according to the invention.

In the case of transparent protective layers, the glass-ceramic cooking plates or other bodies to be coated may additionally be decorated beneath or within the protective layer. Nontransparent protective layers, but also transparent protective layers, can additionally have a decoration on the protective layer.

The process according to the invention for coating a body with a protective layer according to the invention substantially comprises the steps of providing the body and the layer substances in a vacuum system and coating the body by means of a reactive physical vapor deposition process, with layer substances being produced in atomic dimensions and additionally being energy-enriched, so that predominantly morphologically dense column structures, preferably crystalline column structures, are formed during the layer growth.

Application of the layers by ion beam-assisted ion beam sputtering leads to particularly high introductions of energy. This method offers the optimum way of defining the morphology or crystal structure of the layer by controlled setting of the ion energy and intensity of the ion beam. The energy of the ions of the assisting ion beam is in this case between 1 and 2500 eV, preferably between 1 and 800 eV, and particularly preferably between 20 and 450 eV. The ion energy and the intensity of the assisting ion beam must in any event be set in such a way that the application rate of the layer substances remains greater than the removal rate of the layer substances by the additional ion source. The ion beam assistance may also be interrupted from time to time as appropriate.

The deposition of the layers is not restricted to ion beam sputtering. In principle, all sputtering techniques can be used. There are various options for realizing ion bombardment of the growing layer depending on the technique selected. Taking account of the various possible settings in terms of intensity and the choice of ions (noble gases, oxygen, nitrogen, etc.) and the geometric arrangement of the ion sources with respect to the substrate which is to be coated, the person skilled in the art can find suitable settings in this respect making it possible to produce layers according to the invention. In the case of processes which use magnetron sources, by way of example, layers according to the invention can be produced by the use of what is known as an "unbalanced magnetron", a pulsed magnetron, a medium-frequency magnetron source with very-high alternating frequencies or by the application of a negative bias voltage to the substrate. In these processes, the ion bombardment of the growing layer which is required is realized by extraction of the ions from the plasma of the material source. Further measures allowing this to be achieved form part of the prior art. It is additionally possible to combine various measures, in such a manner that particularly strong ion bombardment is achieved.

Moreover, it may be advantageous, preferably in the case of metal oxide layers, in particular in the case of stabilized zirconium oxide layers, to feed at least one additional gas, for example nitrogen, into the vacuum system in order to optimize the material-removal rate during production of the layer substances and/or to optimize the degree of ionization of the reactive gas and/or oxygen with a view to optimizing the oxidation of the layer.

In addition, oxidic layers which, for process technology reasons, have not been completely oxidized and therefore have a disrupted crystal structure can be oxidized further, and thereby annealed by means of a subsequent heat treatment in an oxidizing atmosphere. The heat treatment can be carried out in a receptacle in which the coated body can be heated to temperatures of up to 800° C., preferably to 400° C. to 700° C. In addition, oxygen can be admitted to the receptacle. It is preferable for the oxygen partial pressures which are set to be between $10^{-2}$ and 1000 mbar. The duration of the heat treatment should be between 1 minute and 10 hours, preferably between 10 and 60 minutes.

Depending on the time within the overall production sequence, it may be necessary for the bodies which are to be coated to be subjected to a cleaning operation prior to the coating operation. Cleaning will not necessarily take place if the coating operation immediately follows the final hot step in the production of a glass or glass-ceramic body, since this is when the surfaces are cleanest.

The cleaning of the objects to be coated can be carried out using at least one suitable cleaning bath with final drying in order to remove any soiling from the surface which is to be coated. Depending on the soiling which occurs, it may be necessary to use more than one cleaning bath and to apply additional cleaning effects by heating and/or ultrasound excitation.

Furthermore, it is possible to carry out the cleaning in a vacuum chamber by a plasma treatment with ions, the energy of which is preferably in the range from 1 to 2500 eV, preferably from 50 to 1600 eV, and particularly preferably from 100 to 500 eV. Examples of possible embodiments include bombardment of the substrate with ions from an ion source or "bathing" of the specimen in the plasma of a glow discharge. This results in particularly intensive cleaning of foreign atoms and adsorbates off the surface. Suitable cleaning times are between a few seconds and a few minutes.

Moreover, it is advantageous to activate the surface of the body which is to be coated. The activation may likewise take place in a vacuum chamber, by means of a plasma treatment of the surface, as described above, The cleaning and activation may then if appropriate be carried out in a single process step.

Before the coating operation starts and while the coating operation is being carried out, the body which is to be coated can be heated to the process temperature in the vacuum chamber, for example by means of suitable heating elements in the vacuum chamber. At the start of the process, the temperature of the body may be selected to be between room temperature and 800° C., preferably between 50° C. and 550° C., particularly preferably between 100° C. and 350° C.

Furthermore, it may be desirable to achieve a particularly high surface quality for the body to be coated. For this purpose, the surface can be remachined once again in one or more polishing steps which are suitable for improving the slight surface roughness which remains down to an $R_a$ value of 1 nm.

According to the invention, a body made from glass, glass-ceramic or another nonmetallic, crystalline material, in particular a glass-ceramic hotplate, is coated, in accordance with the invention, with a protective layer, in particular with a protective layer according to the invention, using a coating installation and a production installation (1) which is directly connected to it via an entry lock (2.2) and substrate transfer station (2.1) and in which the body to be coated has been produced immediately beforehand. The coating installation comprises at least one coating chamber (4.1), which is a vacuum chamber, this chamber containing a target (14) comprising the coating starting material, an excitation source for generating layer starting materials in atomic dimensions, an assisting ion beam source (12) directed onto the substrate, at least one process gas inlet valve (15) for feeding process gases into the vacuum chamber, and shutters (7) as closeable openings for supplying and discharging the substrate (8) which is to be coated.

The excitation source may be an ion beam excitation source (13) or a magnetron sputtering source.

In an advantageous embodiment, the coating installation has a cleaning/activation chamber (3), this chamber being a vacuum chamber and having at least one cleaning/activation ion beam source (11) for cleaning and/or activating the substrate (8) arranged between the entry lock (2.2) and the coating chamber (4.1) and connected to the latter via shutters (7).

To produce protective layers having a plurality of individual layers comprising different coating starting materials, it is possible either to exchange the target in the coating chamber or to provide a corresponding number of further coating chambers (4.n). Alternatively, these coating chambers (4.n) may also be occupied by identical coating starting materials, in order in this way to coat a plurality of substrates simultaneously and to increase the throughput rate.

To further optimize metal oxide layers, it may be advantageous for these layers to be aftertreated in an oxygen atmosphere. For this purpose, the coating installation includes an aftertreatment chamber (5), which is likewise a vacuum chamber and includes at least one oxygen feed valve (16) and heating elements (9) and is connected via shutters (7) to the coating chamber (4.1) or a further coating chamber (4.n).

It is preferable for the coating chambers (4.1, 4.n) and the cleaning/activation chamber (3) to include heating elements (9) for heating the substrate (8) and realizing an optimum heating concept during the coating of the substrate (8).

After coating of the substrate (8) and if appropriate aftertreatment of the layer, the substrate (8) is passed out of the coating installation via an exit lock (6.1) and substrate discharge unit (6.2). The exit lock (6.1) is connected to the final vacuum chamber in the processing sequence via a shutter (7).

The invention is to be explained in more detail below on the basis of an exemplary embodiment. In the drawing:

DETAILED DESCRIPTION OF THE INVENTION

Figure 1:
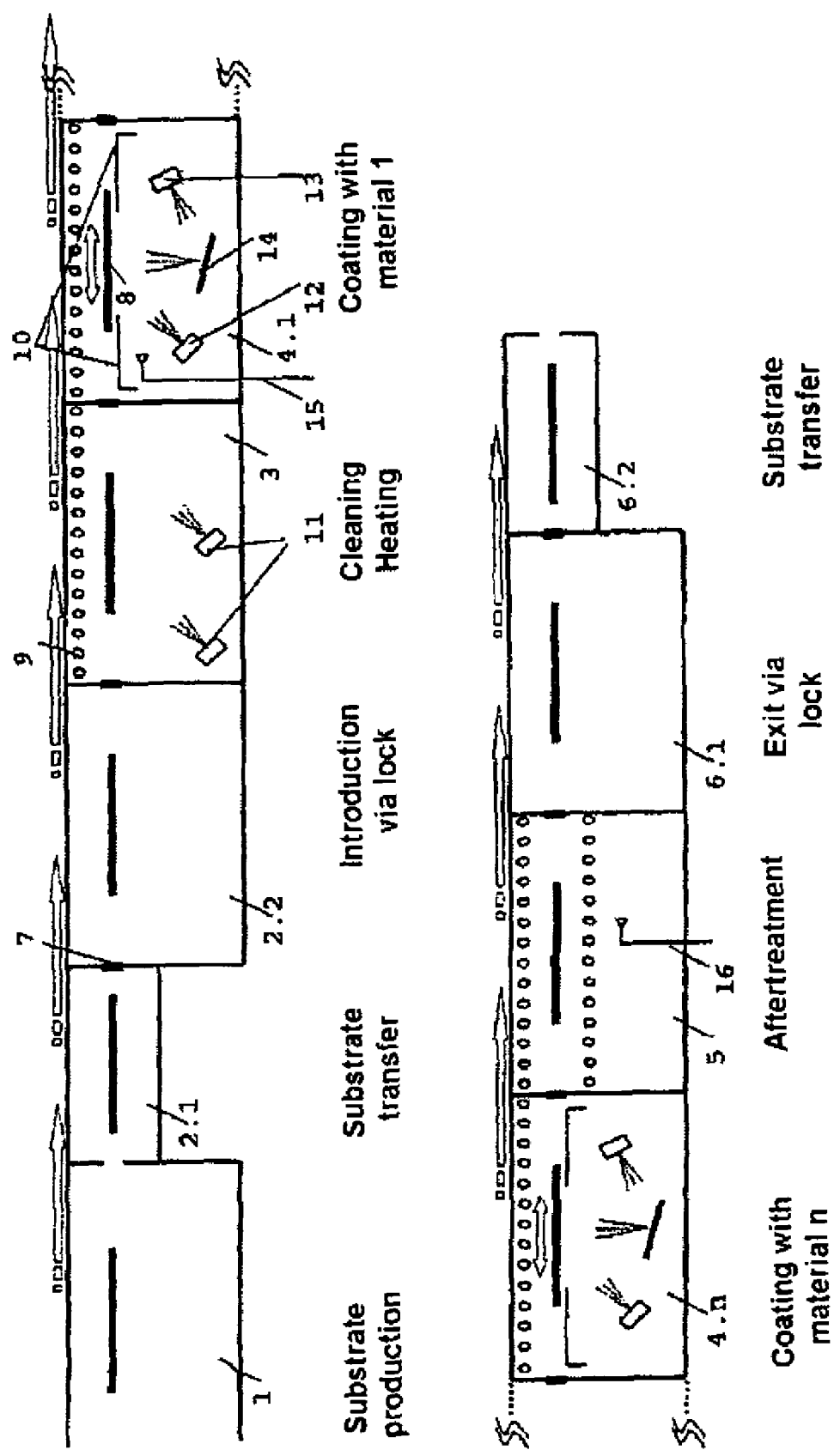
FIG. 1: shows an ion beam sputtering installation with ion beam assistance

Protective layers, in particular transparent, visually attractive, structurally and thermally stable scratchproof layers, for example of stabilized zirconium oxide, can be applied to a glass-ceramic hotplate using an ion beam sputtering installation which is shown in FIG. 1 and operates with ion beam assistance.

Substrate Transfer:

The substrate (8), for example a CERAN plate for cooking hobs, with dimensions of 60 cm×60 cm, immediately after it has been produced, following the final hot step of ceramicization, is transferred from the production installation (1) into the coating installation. The coating installation is a vertical installation which allows the substrates (8) to be coated without edges being formed. The substrates (8) are transferred individually into the coating installation.

After a substrate (8) has been transferred into the substrate transfer station (2.1), the latter is closed and a pressure of <1 mbar is set. Then, the substrate (8) is transferred via a shutter (7) into the entry lock (2.2). The entry lock (2.2) is evacuated, so that a pressure of $<10^{-2}$ mbar is established therein.

In general, the further transfer of the substrate (8) from one process unit to the next within the sputtering installation takes place via the shutters (7). The substrate is then transferred into the cleaning/activation chamber (3).

Substrate Cleaning and Activation:

The cleaning and activation chamber (3) is likewise a vacuum chamber in which there are heating elements (9) for heating the substrate (8) and cleaning/activation ion beam sources (11).

Cleaning does not necessarily have to be carried out, since the coating immediately follows the final hot step in production. If appropriate, the cleaning of the substrate (8) may be carried out in a single step together with the activation of the surface of the substrate (8).

The cleaning/activation chamber (3) is initially evacuated to a process pressure of $<5*10^{-5}$ mbar, and the substrate (8) is heated to a temperature of up to approx. 700° C. Since the substrate (8) has been transferred to the coating operation immediately after the final hot step of ceramicization, heating to these high temperatures involves much lower costs than is the case in known processes.

Then, for cleaning and activation purposes argon ions with an energy of approx. 400 eV are fired onto the surface of the substrate (8) in the cleaning/activation chamber (3). The substrate (8) moves continuously forward at a rate of approx. 3 cm/min. Then, the substrate (8) is transferred into the coating chamber (4.1).

Coating:

The first coating chamber (4.1) is likewise a vacuum chamber and is used for coating with a first starting material. If the coating is to comprise a plurality of layers of different starting materials or if the coating of a plurality of substrates (8) is to be carried out in parallel, it is also possible to add further coating chambers (4.n).

In the first coating chamber (4.1) and in any further coating chambers (4.n) which may be required, there is in each case a target (14) comprising the layer starting material, heating elements (9), diaphragms (10), ion beam excitation source (13) and an assisting ion beam source (12).

The substrate (8) is held at the desired process temperature by the heating elements (9). The layer starting material is metallic zirconium-yttrium in a ratio of 92:8, and is bombarded with a mixture of xenon and argon ions from the ion beam excitation source (13) with an ion energy of 1500 eV. At the same time, oxygen is supplied via the process gas inlet valve (15), so that a zirconium-yttrium oxide film is formed on the substrate (8). The diaphragms (10) define a coating window over the entire length (perpendicular to the substrate direction of movement) of the substrate (8) with a width of 20 cm.

In addition, the substrate (8) is bombarded with argon ions with an ion energy of 100 eV from the assisting ion beam source (12). The substrate (8) is then homogenously coated with a layer thickness of 2 μm as a result of suitable movements over the coating window. After the coating operation, the substrate (8) is transferred into the aftertreatment chamber (5).

Aftertreatment:

The aftertreatment chamber (5) is a vacuum chamber with heating elements (9) and an oxygen feed valve (16).

The substrate (8) is heated to temperatures of >400° C., and an elevated oxygen partial pressure of >$10^{-2}$ mbar is set in the chamber, in order to ensure complete oxidation of the layer.

In principle, it is also possible for this aftertreatment to be carried out outside the coating installation. Following the aftertreatment, the substrate (8) is transferred into the exit lock (6.1), which is then vented to atmospheric pressure. The fully coated substrate (8) leaves the coating installation via the substrate discharge station (6.2).

The coated CERAN cooking plate obtained in this way has a greatly increased resistance to scratching compared to an uncoated cooking plate. The coating is able to withstand mechanical loads, is structurally stable under thermal loads of up to 800° C. and has an attractive optical design.

The invention claimed is:

1. A glass-ceramic hotplate, comprising:
  a nonmetallic, crystalline body having a surface, and
  a protective layer, the protective layer comprising:
  at least one hard-material layer,
  wherein said at least one hard-material layer has a morphologically dense column structure that grows substantially perpendicular to the surface of the body and comprises zirconium oxide in a temperature-stable crystal phase.

2. The glass-ceramic hotplate as claimed in claim 1, wherein said morphologically dense column structure is at least 50% crystalline.

3. The glass-ceramic hotplate as claimed in claim 1, wherein said morphologically dense column structure has a plurality of columns, each column in said plurality of columns has on average a lateral dimension of less than 1 μm.

4. The glass-ceramic hotplate as claimed in claim 1, wherein said at least one hard-material layer comprises silicon nitride.

5. The glass-ceramic hotplate as claimed in claim 1, wherein said at least one hard-material layer further comprises at least one further component admixed to said zirconium oxide for providing said temperature-stable crystal phase.

6. The glass-ceramic hotplate as claimed in claim 5, wherein said at least one further component comprises at least one oxide selected from the group consisting of yttrium oxide, calcium oxide, magnesium oxide, tantalum oxide, niobium oxide, scandium oxide, titanium oxide, the lanthanoid oxide group, and any combinations thereof.

7. The glass-ceramic hotplate as claimed in claim 5, wherein said at least one further component comprises from 0.5 to 50 mol % of $Y_2O_3$.

8. The glass-ceramic hotplate as claimed in claim 7, wherein said at least one further component comprises about 4 mol % of $Y_2O_3$.

9. The glass-ceramic hotplate as claimed in claim 1, wherein said at least one hard-material layer further comprises hafnium oxide.

10. A cooking hob, comprising:
  a coating which includes a hard-material layer formed from a material selected from the group consisting of metal oxide, metal nitride, metal carbide, metal oxynitride, metal carbonitride, metal oxycarbonitride, and any combinations thereof, wherein said at least one hard-material layer has a morphologically dense column structure that grows substantially perpendicular to a surface of the cooking hob.

11. A cooking device, comprising:
  a coating which includes a hard-material layer formed from a material selected from the group consisting of metal oxide, metal nitride, metal carbide, metal oxynitride, metal carbonitride, metal oxycarbonitride, and any combinations thereof, wherein said at least one hard-material layer has a morphologically dense column structure that grows substantially perpendicular to a surface of the cooking device.

* * * * *